United States Patent
Hadiashar et al.

(10) Patent No.: US 10,581,390 B2
(45) Date of Patent: Mar. 3, 2020

(54) ON-CHIP RESISTOR DIVIDER COMPENSATION WITH A 2VRMS INPUT

(71) Applicant: Avnera Corporation, Beaverton, OR (US)

(72) Inventors: Ali Hadiashar, Portland, OR (US); Wai Laing Lee, Austin, TX (US)

(73) Assignee: Avnera Corporation, Beaverton, OR (US)

( * ) Notice: Subject to any disclaimer, the term of this patent is extended or adjusted under 35 U.S.C. 154(b) by 0 days.

(21) Appl. No.: 16/159,281

(22) Filed: Oct. 12, 2018

(65) Prior Publication Data

US 2019/0149105 A1  May 16, 2019

Related U.S. Application Data

(63) Continuation of application No. 15/385,717, filed on Dec. 20, 2016, now Pat. No. 10,135,406, which is a continuation of application No. 14/323,657, filed on Jul. 3, 2014, now Pat. No. 9,525,388.

(60) Provisional application No. 61/842,867, filed on Jul. 3, 2013.

(51) Int. Cl.
| | |
|---|---|
| *H03G 3/20* | (2006.01) |
| *H03F 3/183* | (2006.01) |
| *H03F 1/26* | (2006.01) |
| *H03F 3/187* | (2006.01) |
| *H03F 3/45* | (2006.01) |
| *H03F 3/68* | (2006.01) |

(52) U.S. Cl.
CPC .............. *H03F 3/183* (2013.01); *H03F 1/26* (2013.01); *H03F 3/187* (2013.01); *H03F 3/45475* (2013.01); *H03F 3/45941* (2013.01); *H03F 3/45968* (2013.01); *H03F 3/68* (2013.01); *H03F 2200/03* (2013.01); *H03F 2200/372* (2013.01); *H03F 2203/45418* (2013.01); *H03F 2203/45522* (2013.01); *H03F 2203/45531* (2013.01)

(58) Field of Classification Search
CPC .......... H03G 1/0088; H03G 3/20; H03G 3/30
USPC .................................. 330/86, 144, 282, 284
See application file for complete search history.

(56) References Cited

U.S. PATENT DOCUMENTS

| | | | |
|---|---|---|---|
| 4,107,622 A | 8/1978 | Toyomaki | |
| 6,252,458 B1 | 6/2001 | Shibata | |
| 6,462,621 B1 | 10/2002 | Charles et al. | |
| 8,279,007 B2 * | 10/2012 | Wei | H03F 3/45475 330/284 |
| 9,525,388 B1 | 12/2016 | Hadiashar | |
| 10,135,406 B2 | 11/2018 | Hadiashar et al. | |
| 2009/0167432 A1 | 7/2009 | van den Heuvel | |
| 2012/0229316 A1 | 9/2012 | Loeda et al. | |

\* cited by examiner

*Primary Examiner* — Steven J Mottola
(74) *Attorney, Agent, or Firm* — Knobbe, Martens, Olson & Bear, LLP

(57) ABSTRACT

A new compensation system for an audio input reduces noise by matching feedback ratios in the positive and negative paths. A variable resistance network allows for fine control of resistance trimming in one of the signal paths, which allows for compensation between tolerance of resistors that are external to an integrated circuit and those that are internal to the integrated circuit.

17 Claims, 8 Drawing Sheets

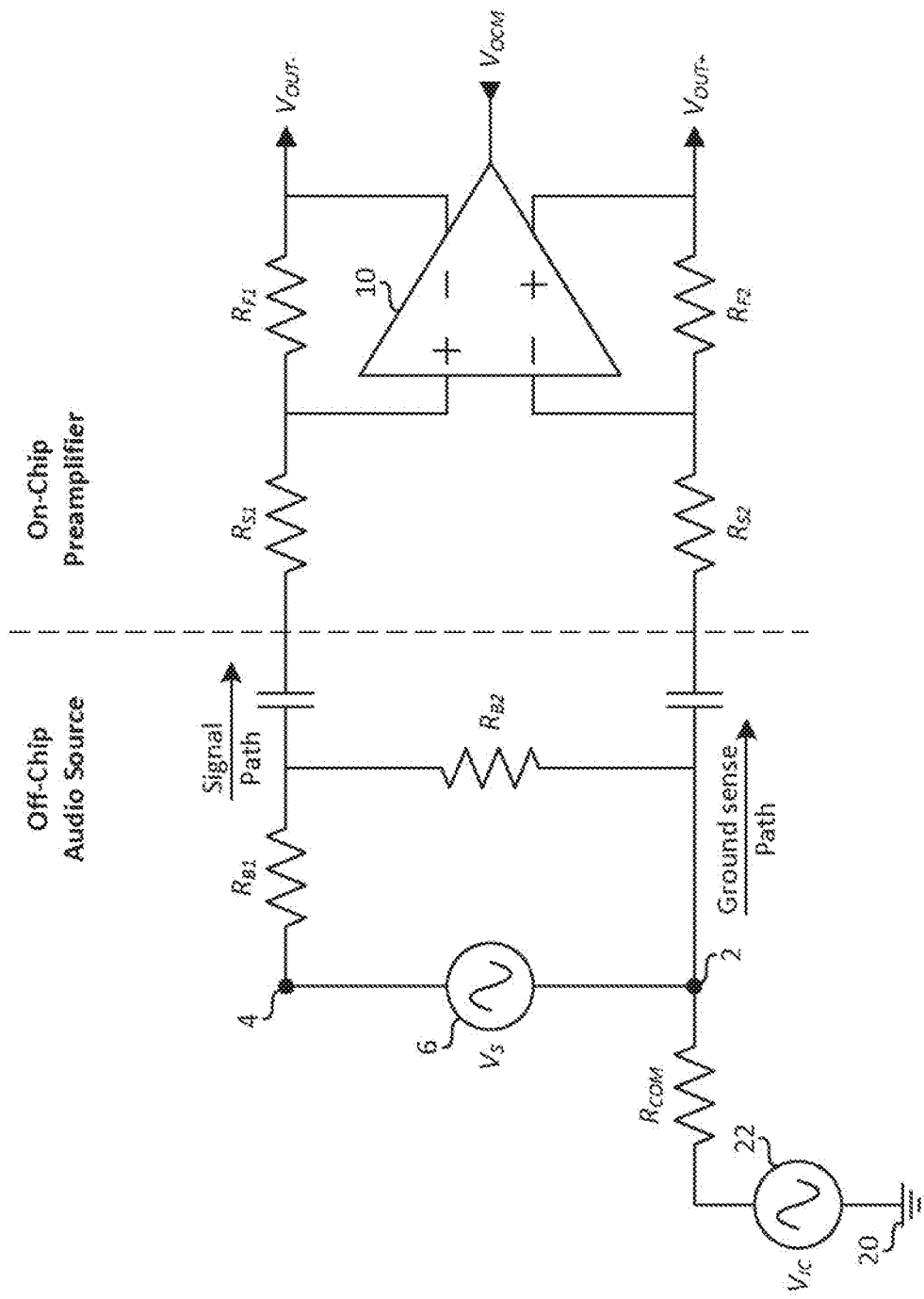
FIG. 1
(Conventional)

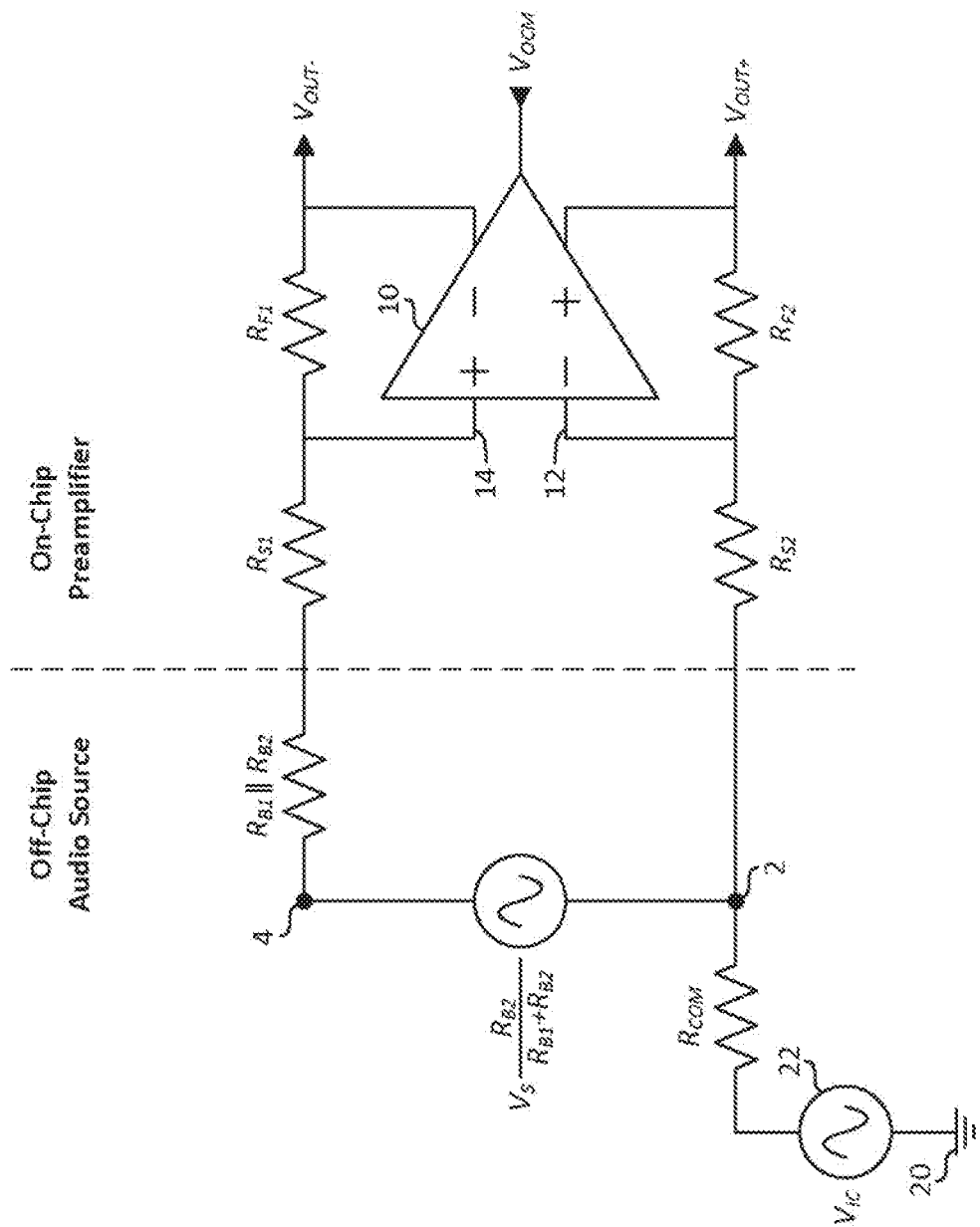
FIG. 2
(Conventional)

ON-CHIP RESISTOR DIVIDER COMPENSATION WITH A 2VRMS INPUT

CROSS REFERENCE TO RELATED APPLICATIONS

This application is a continuation of and claims priority to U.S. Non-Provisional patent application Ser. No. 15/385,717, filed Dec. 20, 2016, entitled ON-CHIP RESISTOR DIVIDER COMPENSATION WITH A 2VRMS INPUT, which is a continuation of and claims priority to U.S. Non-Provisional patent application Ser. No. 14/323,657, filed Jul. 3, 2014, entitled ON-CHIP RESISTOR DIVIDER COMPENSATION WITH A 2VRMS INPUT, which claims benefit of U.S. Provisional Application No. 61/842,867, filed Jul. 3, 2013, entitled ON-CHIP RESISTOR DIVIDER COMPENSATION WITH A 2VRMS INPUT, the disclosures of each of which are hereby incorporated by reference herein.

FIELD OF THE INVENTION

This disclosure is directed to audio inputs, and, more specifically, to a system that compensates a conversion circuit that adjusts a first nominal input voltage to a second nominal input voltage.

BACKGROUND

Typical audio sources such as from a CD player, audio amplifier, or mixer generally produce line outputs in the 2Vrms range. Modern integrated circuits built with modern low-voltage processes, however, cannot handle the full range of a 2Vrms signal, so the input signal must be reduced. This is typically done by dividing the input signal prior to the input voltage signal being applied to the integrated circuit for sound processing.

It is beneficial to have a fully differential input to take advantage of the common mode rejection. The negative terminal is a low impedance ground sense path. Using an external resistor divider causes a mismatch between the external ground to each input of the signal processing chip, which will introduce noise.

Embodiments of the invention address these and other limitations of the prior art.

BRIEF DESCRIPTION OF THE DRAWINGS

FIG. 1 is a circuit diagram illustrating a conventional resistor divider.

FIG. 2 is a Thevenin equivalent diagram of the resistor divider illustrated in FIG. 1.

DETAILED DESCRIPTION

Figure 3:
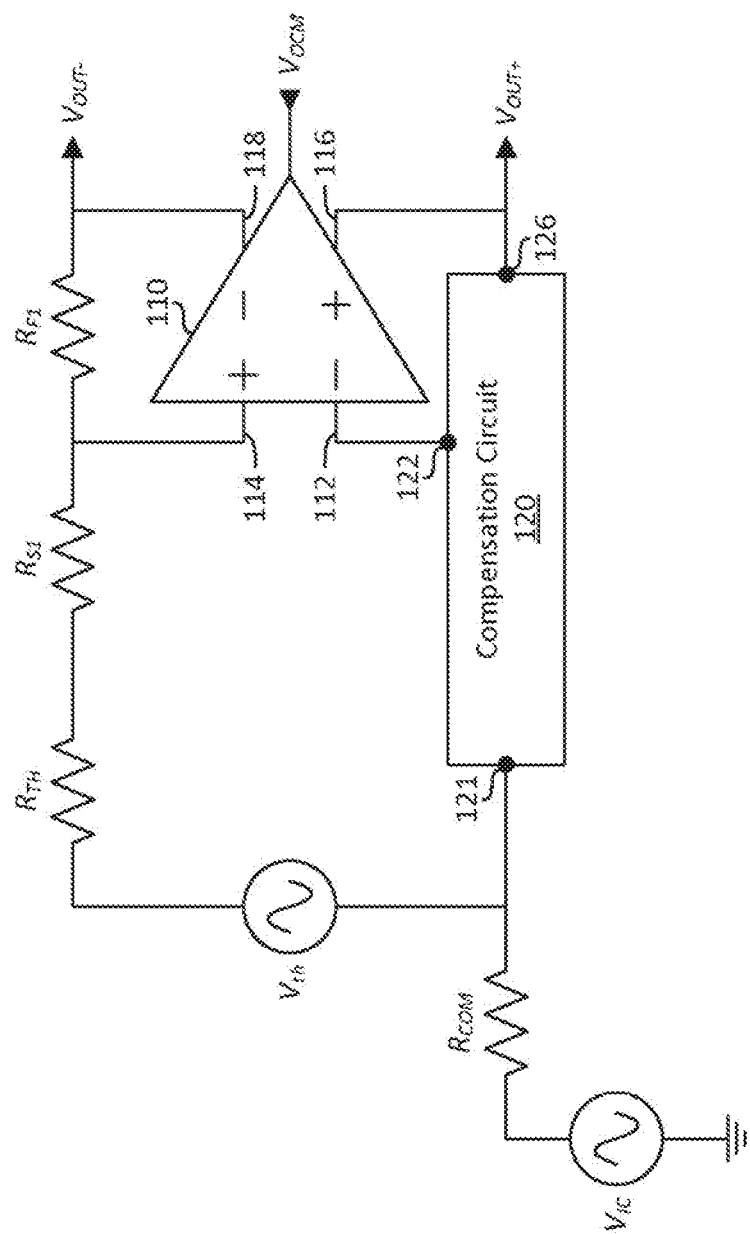
FIG. 3 is a circuit diagram of a Thevenin equivalent of an input divider including a compensation function according to embodiments of the invention.

Embodiments of the invention are directed to an input compensation system, such as for a preamplifier of a coder-decoder (CODEC), that compensates for noise presented on common mode inputs, such as noise on the ground plane and noise on the common mode reference voltage. Without such compensation, the system has a significant common mode noise component. Much of the noise, however, may be eliminated by using embodiments of the invention, which compensates for mismatch in the feedback gains of the signal path and ground sense path.

It is beneficial to use a fully differential input to take advantage of the common mode rejection. As mentioned above, a 2 Vrms input signal is conventionally divided using a resistor divider, such as illustrated in FIG. 1, to provide a 1 Vrms level for an on-chip pre-amplifier or other input circuit. In FIG. 1, components to the right of the vertical dotted line are formed within an integrated circuit (IC), such as a CODEC or other audio component, while components to the left of the vertical line are external to the sound processing IC.

In FIG. 1 an audio signal 6 is supplied between a ground sense node 2 and an audio input node 4. A ground sense path is the path between the ground sense node 2, through an operational amplifier 10 to an output $V_{OUT+}$. Similarly, a signal path is the path between the signal node 4, through the operational amplifier 10 to an output $V_{OUT-}$.

The resistors in the resistor divider circuit formed by $RB_1$, $RB_2$ are chosen in conjunction with the internal resistor network ($RS_1$, $RS_2$, $RF_1$, $RF_2$) to not disturb the total gain of the signal path. The equivalent resistance of the resistor divider is considered as part of the input resistor when considering the gain, as illustrated in FIG. 2.

As illustrated in FIG. 2, which is the Thevenin equivalent diagram of the circuit in FIG. 1, resistances in the signal path no longer match resistances in the ground sense path because of the presence of the resistor divider circuit. This mismatch introduces noise. The Thevenin equivalent of the external network $RB_1$, $RB_2$ illustrated in FIG. 2, is as follows:

$$v_{th} = v_s \frac{R_{B2}}{R_{B1} + R_{B2}}$$

$$R_{TH} = R_{B1} \parallel R_{B2}$$

Feedback ratios for the signal path and ground sense path can be calculated as follows:

$$\beta_1 = \frac{R_{S1} + R_{TH}}{R_{S1} + R_{TH} + R_{F1}}$$

$$\beta_2 = \frac{R_{S2}}{R_{S2} + R_{F2}}$$

The transfer function from common mode inputs to an output of the operational amplifier 10 as a function of the feedback ratios is defined as:

$$\frac{v_{OUT}}{(v_{OCM} - v_{ic})} = \frac{2 \cdot (\beta_1 - \beta_2)}{\beta_1 + \beta_2}$$

With no adjustments: ($R_{S1}=R_{S2}, R_{F1}=R_{F2}(\beta_1 \neq \beta_2)$), the feedback ratios do not cancel out and a significant signal from the common mode inputs to the output exists:

$$\frac{v_{OUT}}{(v_{OCM} - v_{ic})} = \frac{1}{\frac{R_S}{R_F} \frac{(R_S + R_{TH} + R_F)}{R_{TH}} + 1}$$

For better common mode rejection, it is best to match $\beta1=\beta2$ as closely as possible.

$R_{S1}=R_S$
$R_{F1}=R_F$
$R_{S2}=R_S+R_X$
$R_{F2}=R_F$

Where $R_{S2}$ is skewed by the Thevenin equivalent resistance so that the two paths match ($R_X=R_{TH}$). With this shift, $\beta_1$ and $\beta_2$ closely match and the common mode signal can be canceled.

Although external resistors generally have 1% precision, on-chip resistors are typically formed of polysilicon and may have up to +/−20% variation in their resistance values. This variation limits the ability to match $\beta1$ and $\beta2$ as closely as desired. Not being able to closely match the desired resistance values, due to the processing variations in making polysilicon resistors, as set forth above, increases noise from the common mode inputs.

Still with reference to FIG. 2, the resistance value of $R_{S2}$ will vary with the polysilicon process by ±20%, because $R_{S2}$ is located on the IC. Conversely, the resistance value of $R_{TH}$, which is located off the IC, will vary only by approximately 1%. This will skew the feedback ratios as follows:

$$\beta_{1\Delta} = \frac{R_S(1+\Delta_{ply}) + R_{TH}}{R_S(1+\Delta_{ply}) + R_{TH} + R_F(1+\Delta_{ply})}$$

$$\beta_{2\Delta} = \frac{R_S(1+\Delta_{ply}) + R_X(1+\Delta_{ply})}{R_S(1+\Delta_{ply}) + R_X(1+\Delta_{ply}) + R_F(1+\Delta_{ply})}$$

$$\beta_{1\Delta} = \frac{R_S + \frac{R_{TH}}{1+\Delta_{ply}}}{R_S + \frac{R_{TH}}{1+\Delta_{ply}} + R_F}$$

$$\beta_{2\Delta} = \frac{R_S + R_X}{R_S + R_X + R_F}$$

Figure 4:
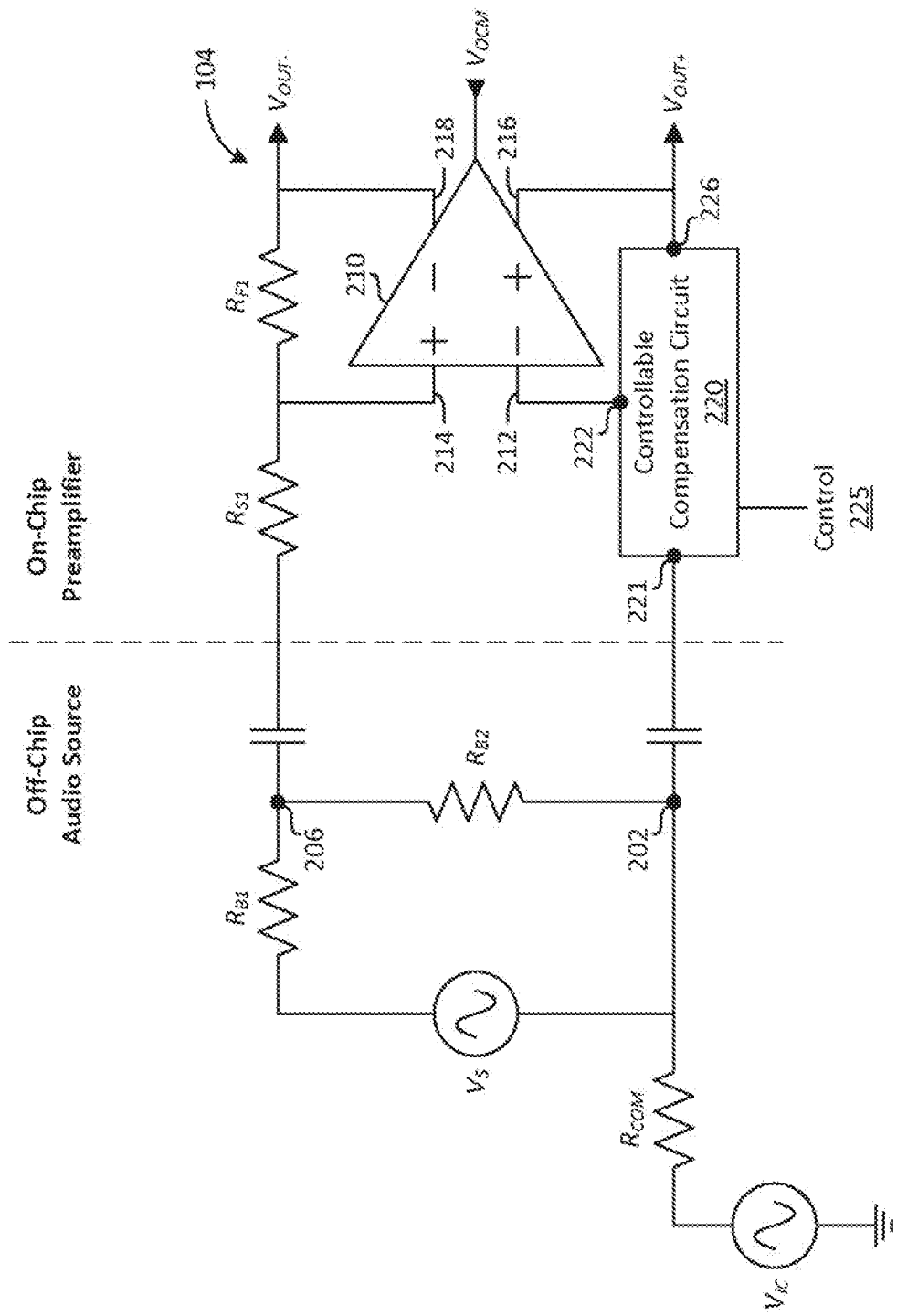
FIG. 4 is a circuit diagram of a pre-amplification circuit including a resistance compensation circuit according to embodiments of the invention.

To compensate for this mismatch, embodiments of the invention skew the internal ground sense path with a fine resistor trim, which is performed within a compensation circuit 120 located within the ground sense path. The compensation circuit 120 may be used to account for the +/−20% variation in polysilicon resistance that occurs when producing the IC. The variation of polysilicon resistance can be determined by an on-chip process monitor, as described in detail below:

FIG. 4 is a circuit diagram of a pre-amplification circuit in an on-chip preamplifier 104 including a compensation circuit according to embodiments of the invention. In comparison with the conventional amplifier illustrated in FIG. 1, embodiments of the invention include a controllable compensation circuit 220. The compensation circuit 220 may have three terminals, an input terminal 221 coupled to a low impedance ground sense node 202, a central terminal 222 coupled to an inverting input 212 of an operational amplifier 210, and an output terminal 226 coupled to a non-inverting output 216 of the operational amplifier 210.

The compensation circuit 220 is controlled by a control 225 to vary an amount of resistance between the three nodes 221, 222, and 226. In practice, after measuring a resistance value on the IC, such as, for example, measuring a control polysilicon resistor on the IC, the control 225 may be set to compensate for the variation by adjusting an amount of resistance provided at the three nodes 221, 222, and 226. This has the desired effect, of balancing values such that $\beta_{1\Delta}=\beta_{2\Delta}$, reducing the noise in the preamplifier 104.

Figure 5A:
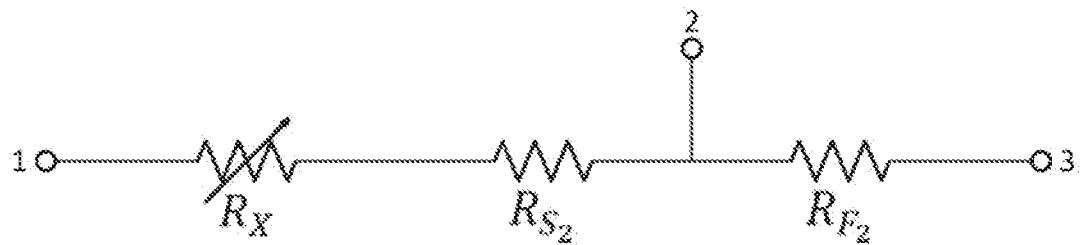
FIG. 5A is a schematic diagram of an example compensation circuit according to an embodiment of the invention.
Figure 5B:
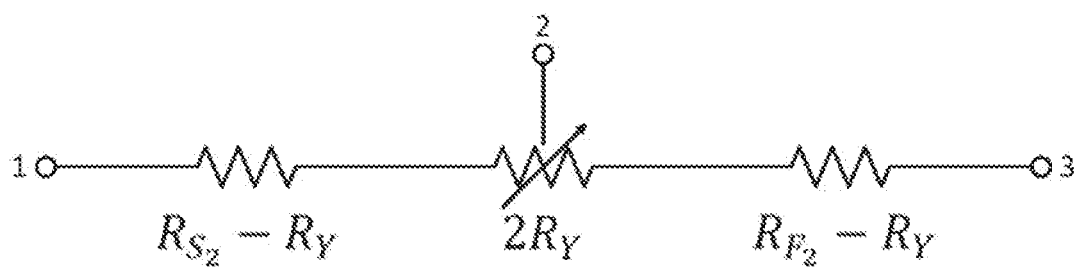
FIG. 5B is a schematic diagram of an example compensation circuit according to another embodiment of the invention.

FIGS. 5A and 5B are schematic diagrams of example controllable resistor circuits that may be used in compensation circuits according to an embodiment of the invention.

The controllable resistor circuit illustrated in FIG. 5A includes a resistance $R_{F2}$ coupled between nodes 2 and 3, and includes a resistance $R_{S2}$ coupled between nodes 1 and 2. Further included between nodes 1 and 2 is a controllable resistor $R_X$, which is controllable in the sense that its resistance value can be changed. Changing the resistor value $R_X$ changes the resistance values between nodes 1 and 2 as well as between nodes 2 and 3 of the controllable resistor circuit illustrated in FIG. 5A. This embodiment of the resistance circuit is the one used for the calculations set forth above for matching $\beta1$ and $\beta2$.

In operation, using embodiments of the invention as illustrated in FIG. 5A, the resistance $R_X$ is adjusted inversely in proportion to the measured polysilicon resistance variation to match $\beta_{1\Delta}=\beta_{2\Delta}$.

$$R_X = \frac{R_{TH}}{1+\Delta_{ply\_meas}}.$$

The controllable resistor circuit illustrated in FIG. 5B uses a variable resistor $R_Y$ between resistances $R_{S2}$–$R_Y$ and $R_{F2}$–$R_Y$. As the resistor $R_Y$ is changed, so necessarily do the resistances $R_{S2}$–$R_Y$ and $R_{F2}$–$R_Y$ change. Controlling the resistance of resistor $R_Y$ may be thought of as controlling a wiper on a mechanical variable resistor coupled between nodes 1 and 3.

The resistance $R_Y$ may be related to the resistance $R_X$ described above by the following linear transformation:

$$B_{2X} = B_{2Y}$$

$$\frac{R_S + R_X}{R_S + R_X + R_F} = \frac{R_S + R_Y}{R_S + R_Y + R_P - R_Y}$$

$$R_Y = \frac{R_X R_F}{R_S + R_F + R_X}, \text{ where } R_X = R_{TH}$$

In operation, using embodiments of the invention as illustrated in FIG. 5B, the resistance $R_Y$ is adjusted inversely in proportion to the measured polysilicon resistance variation to match $\beta_{1A}=\beta_{2A}$.

$$R_y = \frac{R_X R_F}{R_S + R_F + R_X}, \text{ where } R_X = \frac{R_{TH}}{1 + \Delta_{ply\_meas}}$$

Figure 6A:
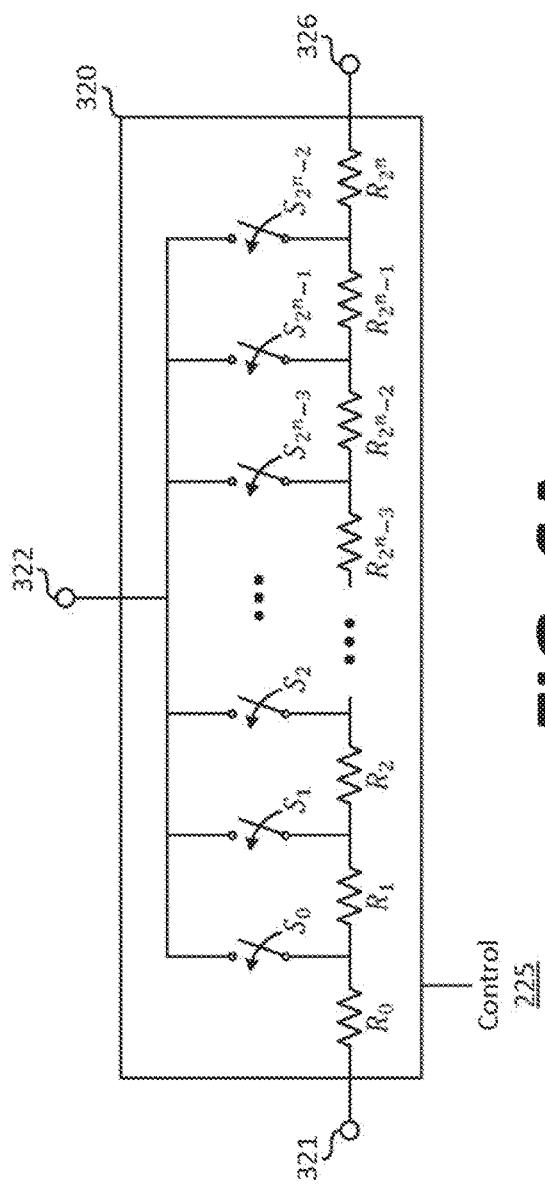
FIG. 6A is a schematic diagram of an example compensation circuit according to another embodiment of the invention.

FIG. 6A is a circuit diagram illustrating an example embodiment of the compensation circuit 320 of FIG. 4 that uses the resistance circuit illustrated in FIG. 5B, according to embodiments of the invention. The compensation circuit 320 may be an example of the compensation circuit 220 of FIG. 4, for instance.

In the compensation circuit 320 of FIG. 6A, a series of resistors $R_0$–$R_2''$ are coupled between nodes 321 and 326. Then, a series of controllable switches $S_0$–$S_{2''-1}$ couples a selectable number of the series of resistors between the nodes 321 and 322. Controlling the series of controllable switches $S_0$–$S_{2''-1}$ may be thought of as controlling a wiper on a mechanical variable resistor.

Figure 6B:
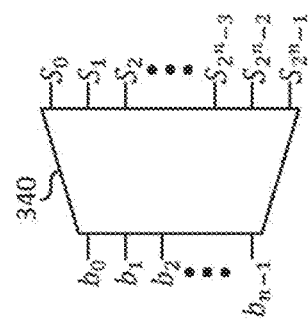
FIG. 6B is a schematic diagram of a compensation controller for use with the compensation circuit illustrated in FIG. 6A.

The series of controllable switches $S_0$–$S_{2''-1}$ in FIG. 6A may be controlled by a control circuit, such as a control circuit 340 illustrated in FIG. 6B. In this embodiment, the control circuit 340 is embodied by an n-to-$2^n$ decoder that operates conventionally. For example, in a four-input decoder, an input from the four inputs is decoded to select exactly one of sixteen outputs. The selected output then causes its respective switch to which it is coupled to close, thereby changing the ratios of resistance between the three nodes 321, 322, 326. In some embodiments of the invention, each one of the outputs from the decoder is coupled to a unique switch controller, as illustrated in FIG. 6A. Each switch is coupled between two adjacent resistors. In some embodiments of the invention the resistance of the resistors in the compensation circuit may be identical, while in others they may be non-identical. Further, a number of separate resistors in $R_0$–$R_2''$ used to successfully compensate for the mismatch may be calculated based on the percentage variation in resistance, e.g., –/–20%, as well as the what the level of common mode rejection is desired. In some embodiments the number of switches $S_0$–$S_{2''-1}$ may be, for example, as few as 4, and as many as 16, and preferably between 8 and 16. Embodiments of the invention work in the same manner no matter the number of separate switches are used. Also, FIG. 6A illustrates one more resistor than switch, but such details are likely implementation specific.

In operation, with reference to FIGS. 6A, 6B, and 3, for instance, if the output of the decoder 340 is "$S_2$", then the switch controlled by the signal $S_2$ connects node 221 to node 222 through exactly 3 resistors. If instead the decoder output were $S_1$, then the switch controlled by the signal $S_1$ would connect the nodes 221 and 222 together through exactly 2 resistors, and specifically $R_0$, $R_1$, and $R_2$. Note that the nodes 221 and 226 are coupled through the same number of resistors $R_0$–$R_2''$ regardless of which switch is selected in the compensation circuit 340. Thus, with reference back to FIGS. 5B and 3, the resistance $R_Y$ is controllable, which effectively allows control of the amount of resistance supplied to the inverting input 112 of the operational amplifier 110. Controlling this path effectively compensates for any input signal mismatch by adjusting the feedback ratio β2 to match that of β1.

In some embodiments the controller 340 may be set to automatically select a middle value of resistance as a starting point. For example, if the production process yields target polysilicon resistance values, then no further "fine-tuning" control may be necessary for input compensation.

Determining which of the controllable switches $S_0$–$S_{2''-1}$ to operate in FIG. 5A is based on a resistance mismatch between resistance values inside the IC and resistance values outside the IC. For example, a polysilicon resistor internal to the IC may be formed having a target resistance value that exactly matches a resistance value of a resistor outside of the IC. One example uses 64 KOhm resistor values for both the internal and external resistor. Then a constant current, for example a constant reference current from the bandgap is driven through both the internal and external resistors. A voltage is measured on each of the current paths through the internal and external resistors, and the measured voltages are compared to one another. The ratio of compared voltages is directly proportional to the difference in resistor values between the internal and external resistances. This relationship is then used to determine how to skew the resistances within the compensation circuit in the ground sense path so that gains in the ground sense path match those in the signal path.

An additional calibration method includes injecting a supersonic (i.e., >20 KHz) signal into the common mode reference voltage $V_{OCM}$. If the circuit is matched, i.e., the internal and external resistors are in their proper relationships to one another, without variation from the intended resistance values, then the injected signal is attenuated by the common mode rejection. If, however, there is any mismatch between the gain of the signal path and the gain of the ground sense path, then a residual signal from the injected signal will appear in the output signals $V_{OUT-}$ and $V_{OUT+}$. Then, the residual signal may be isolated from other signals on the output signals using digital sound processing. Finally, the resistance values of the compensation circuit may be trimmed, using techniques described above, to shift the resistance values between the nodes coupled to the compensation circuit. In particular, the resistance values in the compensation circuit are adjusted until the residual signal in the output signals $V_{OUT-}$ and $V_{OUT+}$ is minimized. This method of calibration is attractive because, since the tone is supersonic, i.e., above the threshold of human hearing, the calibration may run continuously or periodically in the background and never be heard by the user. Additionally, since the calibration takes place while the pre-amplifier circuit is operational, it does not require an additional setup step to perform the calibration.

Other embodiments may use other methods of controlling the resistance between the nodes 321, 322, 326.

Figure 7:
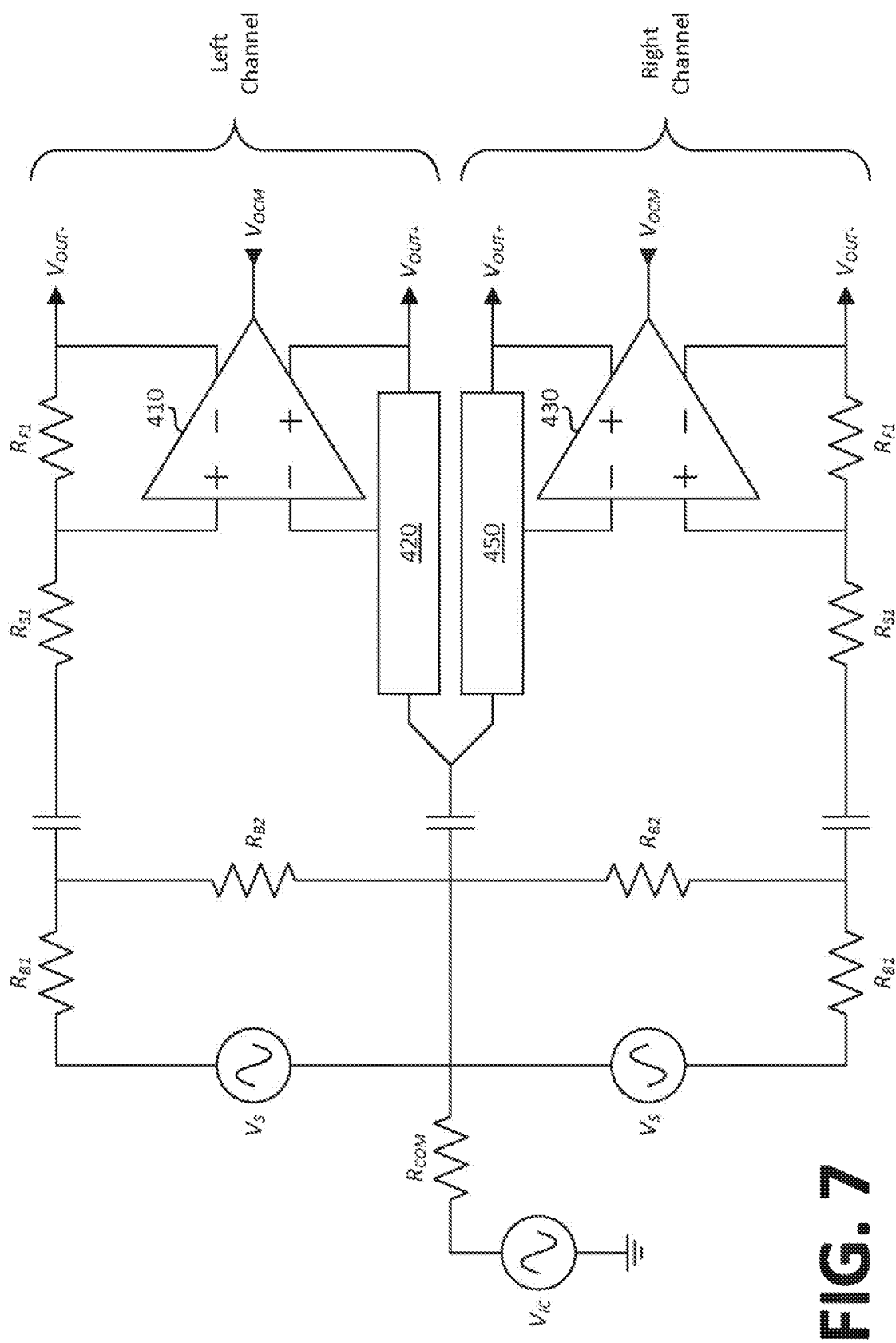
FIG. 7 is a circuit diagram illustrating a two-channel resistor divider providing input for a two-channel pre-amplification circuit according to further embodiments of the invention.

FIG. 7 is a circuit diagram illustrating a two-channel resistor divider, on which embodiments of the invention may be applied. This embodiment includes two operational amplifiers 410, 430, each of which may be used for a separate channel, for example a left channel and a right channel of a stereo preamplifier. Compensation circuits 420, 450 may be coupled in the same way as the single channel embodiment illustrated in FIG. 4. Such an embodiment as illustrated in FIG. 7 allows each channel of a two-input pre-amplifier to be separately controlled to minimize input noise. A further embodiment, not illustrated, reduces crosstalk between the two channels, i.e., between the right and left channels. The embodiment includes providing an additional capacitor, so that each of the two $RS_2$ resistors in FIG. 7 includes a capacitor between it and the ground sense node. This reduces cross talk between the two channels that occurs when sharing the ground sense capacitor, and further reduces noise in the system.

Figure 8:
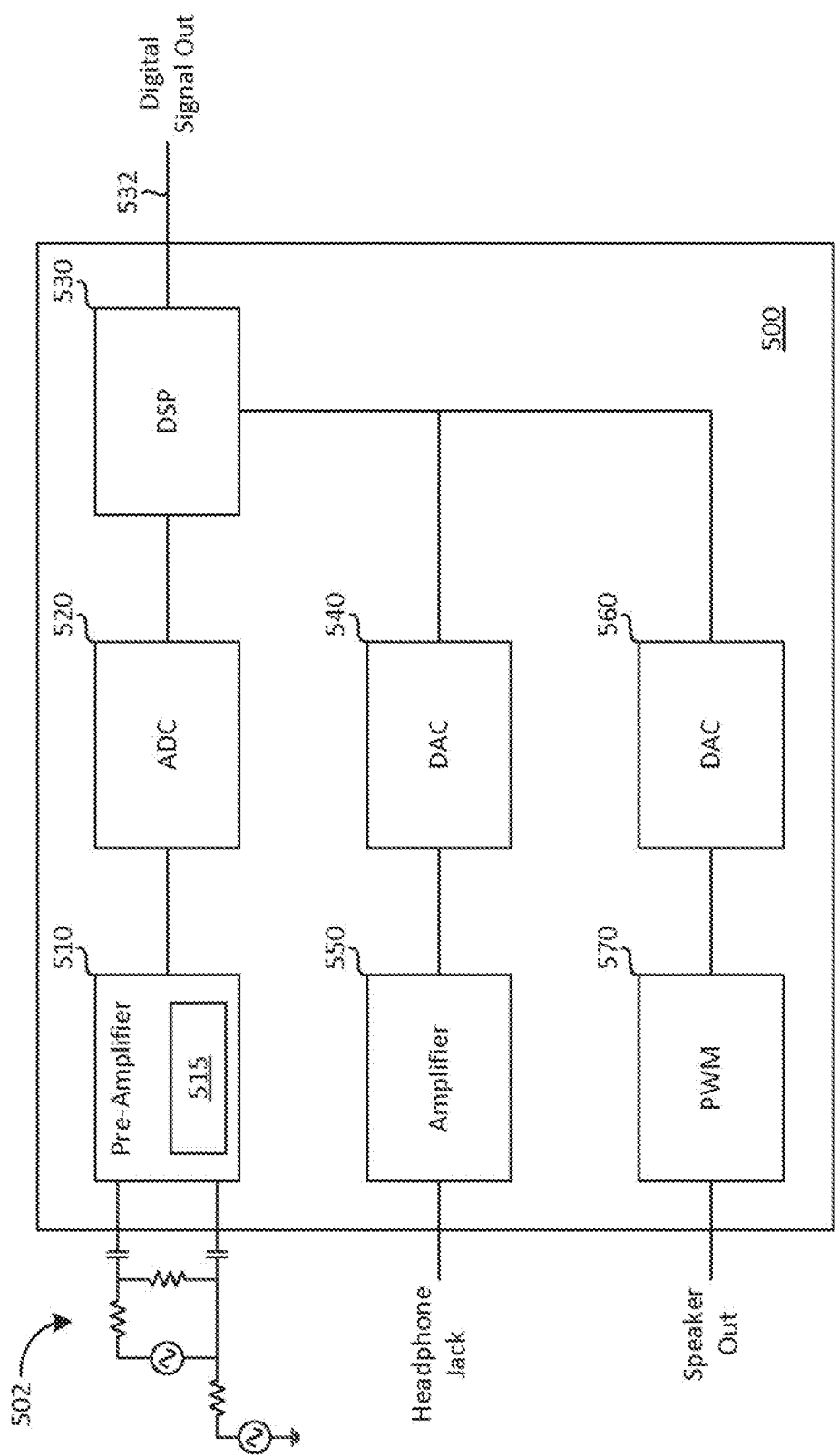
FIG. 8 is a block diagram of a CODEC including a pre-amplifier having input compensation according to embodiments of the invention.

FIG. 8 is a functional block diagram of an example CODEC IC 500 incorporating embodiments of the invention. A resistor divider 502 is located off chip from the CODEC IC 500, and provides an audio input signal to the CODEC. The input signal is received by a preamplifier 510 that includes an input compensator 515. The input compensator 515 functions as those described above to limit noise caused by the mismatch introduced from the external divider.

The preamplifier 510 passes the reduced-noise input to an internal component, such as an Analog to Digital Converter (ADC) to convert the analog input signal to a digital audio signal. A sound processor such as a Digital Signal Processor (DSP) 530 may perform varied effects on the digital audio signal, such as noise reduction, equalization, balance, or other enhancements. An output of the DSP 530 may be provided as a digital signal output 532 of the CODEC IC 500.

Depending on the type of CODEC IC 500, outputs from the DSP 530 may also be coupled to Digital to Analog converters 540, 560 to convert the processed signals back to audio analog signals. These signals may be provided to, for example, a headphone amplifier 550 coupled to a headphone jack, or to a PWM processor 570 for providing an amplified output to drive speakers.

Embodiments of the invention may be incorporated into integrated circuits such as sound processing circuits, or other audio circuitry. In turn, the integrated circuits may be used in audio devices such as sound bars, audio docks, amplifiers, speakers, etc.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated.

In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention.

The invention claimed is:

1. An audio preamplifier implemented on an integrated circuit and comprising:
  an operational amplifier having an inverting input and a non-inverting output; and
  a configurable compensation circuit configured to compensate for variation in a polysilicon resistance of the integrated circuit, the configurable compensation circuit including a first resistor, a second resistor, and a configurable resistor network, the first resistor and the configurable resistor network in electrical communication between an input of the audio preamplifier and the inverting input of the operational amplifier, the second resistor in electrical communication between the inverting input and the non-inverting output of the operational amplifier, and the configurable resistor network including a plurality of resistors and a plurality of switches, each switch of the plurality of switches coupled between a different pair of resistors of the plurality of resistors and the inverting input of the operational amplifier.

2. The audio preamplifier of claim 1 wherein the first resistor is coupled between an input to the configurable compensation circuit and the configurable resistor network, and the configurable resistor network is coupled between the first resistor and the second resistor.

3. An audio preamplifier implemented on an integrated circuit and comprising:
  an operational amplifier having an inverting input and a non-inverting output; and
  a configurable compensation circuit including a first resistor, a second resistor, and a configurable resistor network, the first resistor and the configurable resistor network in electrical communication between an input of the audio preamplifier and the inverting input of the operational amplifier, the second resistor in electrical communication between the inverting input and the non-inverting output of the operational amplifier, the configurable resistor network including a plurality of resistors and a plurality of switches, each switch of the plurality of switches coupled between a different pair of resistors of the plurality of resistors and the inverting input of the operational amplifier, the configurable resistor network coupled between an input to the configurable compensation circuit and the first resistor, and the first resistor coupled between the configurable resistor network and the second resistor.

4. An audio preamplifier implemented on an integrated circuit and comprising:
  an operational amplifier having an inverting input and a non-inverting output; and
  a configurable compensation circuit including a first resistor, a second resistor, and a configurable resistor network, the first resistor and the configurable resistor network in electrical communication between an input of the audio preamplifier and the inverting input of the operational amplifier, the second resistor in electrical communication between the inverting input and the non-inverting output of the operational amplifier, the configurable resistor network including a plurality of resistors and a plurality of switches, each switch of the plurality of switches coupled between a different pair of resistors of the plurality of resistors and the inverting input of the operational amplifier, the input of the audio preamplifier being a ground sense input, the configurable compensation circuit within a ground sense path of the audio preamplifier, and the audio preamplifier further including a signal input in electrical communication with a non-inverting input of the operation amplifier.

5. An audio preamplifier implemented on an integrated circuit and comprising:
  an operational amplifier having an inverting input and a non-inverting output;
  a configurable compensation circuit including a first resistor, a second resistor, and a configurable resistor network, the first resistor and the configurable resistor network in electrical communication between an input of the audio preamplifier and the inverting input of the operational amplifier, the second resistor in electrical communication between the inverting input and the non-inverting output of the operational amplifier, the configurable resistor network including a plurality of resistors and a plurality of switches, each switch of the plurality of switches coupled between a different pair of resistors of the plurality of resistors and the inverting input of the operational amplifier; and a controller circuit in electrical communication with a switch of the plurality of switches and configured to control a configuration of the switch, the controller circuit implemented as a decoder.

6. An audio preamplifier implemented on an integrated circuit and comprising:

an operational amplifier having an inverting input and a non-inverting output;

a configurable compensation circuit including a first resistor, a second resistor, and a configurable resistor network, the first resistor and the configurable resistor network in electrical communication between an input of the audio preamplifier and the inverting input of the operational amplifier, the second resistor in electrical communication between the inverting input and the non-inverting output of the operational amplifier, the configurable resistor network including a plurality of resistors and a plurality of switches, each switch of the plurality of switches coupled between a different pair of resistors of the plurality of resistors and the inverting input of the operational amplifier; and a controller circuit in electrical communication with a switch of the plurality of switches and configured to control a configuration of the switch, the controller circuit configured to measure a resistance of a control polysilicon resistor on the integrated circuit and to control the configuration of the switch based at least in part on the measured resistance of the control polysilicon resistor so as to modify a resistance of the configurable compensation circuit.

7. The audio preamplifier of claim 1 wherein at least one resistor from the plurality of resistors has a different resistance than at least one other resistor from the plurality of resistors.

8. The audio preamplifier of claim 1 wherein the configurable compensation circuit is configured to account for up to a 20% variation in a polysilicon resistance of the integrated circuit.

9. A multi-channel audio preamplifier implemented on an integrated circuit and comprising:

a first audio preamplifier corresponding to a first audio channel, and including a first operational amplifier and a first configurable compensation circuit that includes a first resistor, a second resistor, and a first configurable resistor network, the first resistor and the first configurable resistor network in electrical communication between an input of the first audio preamplifier and an inverting input of the first operational amplifier, the second resistor in electrical communication between the inverting input and a non-inverting output of the first operational amplifier, and the first configurable resistor network including a first plurality of resistors and a first plurality of switches, each of the first plurality of switches coupled between a different pair of resistors of the first plurality of resistors and the inverting input of the first operational amplifier; and a second audio preamplifier corresponding to a second audio channel, and including a second operational amplifier and a second configurable compensation circuit that includes a third resistor, a fourth resistor, and a second configurable resistor network, the third resistor and the second configurable resistor network in electrical communication between an input of the second audio preamplifier and an inverting input of the second operational amplifier, the fourth resistor in electrical communication between the inverting input and a non-inverting output of the second operational amplifier, and the second configurable resistor network including a second plurality of resistors and a second plurality of switches, each switch of the second plurality of switches coupled between a different pair of resistors of the second plurality of resistors and the inverting input of the second operational amplifier, the first configurable compensation circuit and the second configurable compensation circuit configured to compensate for variation in a polysilicon resistance of the integrated circuit.

10. The multi-channel audio preamplifier of claim 9 wherein the input of the first audio preamplifier and the input of the second audio preamplifier is a shared ground sense input, the first configurable compensation circuit is within a first ground sense path of the first audio preamplifier and the second configurable compensation circuit is within a second ground sense path of the second audio preamplifier, the first ground sense path and the second ground sense path in electrical communication with the shared ground sense input.

11. The multi-channel audio preamplifier of claim 10 wherein the first ground sense path includes a first capacitor in electrical communication with the first configurable compensation circuit and the second ground sense path includes a second capacitor in electrical communication with the second configurable compensation circuit, the first capacitor and the second capacitor configured to reduce cross-talk between the first audio channel and the second audio channel.

12. The multi-channel audio preamplifier of claim 9 further comprising a controller circuit in electrical communication with a switch of the first plurality of switches and configured to control a configuration of the switch.

13. The multi-channel audio preamplifier of claim 12 wherein the controller circuit is implemented as a decoder circuit.

14. The multi-channel audio preamplifier of claim 12 wherein the controller circuit is configured to measure a resistance of a control polysilicon resistor on the integrated circuit and to control the configuration of the switch based on the measured resistance of the control polysilicon resistor.

15. The multi-channel audio preamplifier of claim 9 wherein at least some of the first plurality of resistors have different resistances than at least some other of the first plurality of resistors.

16. The multi-channel audio preamplifier of claim 9 wherein the variation in the polysilicon resistance of the integrated circuit is determined by an on-chip process monitor.

17. A coder-decoder comprising:

an audio preamplifier configured to receive an audio input signal and generate a reduced-noise version of the audio input signal, the audio preamplifier including an operational amplifier and a configurable compensation circuit including a first resistor, a second resistor, and a configurable resistor network, the first resistor and the configurable resistor network in electrical communication between an input of the audio preamplifier and an inverting input of the operational amplifier, the second resistor in electrical communication between the inverting input and a non-inverting output of the operational amplifier, and the configurable resistor network including a plurality of resistors and a plurality of switches, each switch of the plurality of switches coupled between a different pair of resistors of the plurality of resistors and the inverting input of the operational amplifier;

an analog to digital converter configured to receive the reduced-noise version of the audio input signal from the audio preamplifier and to convert the reduced noise version of the audio input signal to a digital audio signal; and a digital signal processor configured to process the digital audio signal to obtain an enhance signal and to output the enhanced signal as an output of the coder-decoder.

\* \* \* \* \*